US010600902B2

United States Patent
Xu

(10) Patent No.: US 10,600,902 B2
(45) Date of Patent: Mar. 24, 2020

(54) SELF-REPAIRING FIELD EFFECT TRANSISITOR

(75) Inventor: Robert Xu, Fremont, CA (US)

(73) Assignee: Vishay Siliconix, LLC, San Jose, CA (US)

( * ) Notice: Subject to any disclaimer, the term of this patent is extended or adjusted under 35 U.S.C. 154(b) by 0 days.

(21) Appl. No.: 12/030,719

(22) Filed: Feb. 13, 2008

(65) Prior Publication Data

US 2009/0200578 A1    Aug. 13, 2009

(51) Int. Cl.
*H01L 27/06* (2006.01)
*H01L 29/78* (2006.01)
*H01L 23/525* (2006.01)
*H01L 27/088* (2006.01)
*H01L 29/417* (2006.01)
*H01L 29/66* (2006.01)
*H01L 29/808* (2006.01)

(52) U.S. Cl.
CPC ...... *H01L 29/7802* (2013.01); *H01L 23/5256* (2013.01); *H01L 27/088* (2013.01); *H01L 29/41741* (2013.01); *H01L 29/66734* (2013.01); *H01L 29/7813* (2013.01); *H01L 29/8083* (2013.01); *H01L 2924/0002* (2013.01)

(58) Field of Classification Search
CPC ........... H01L 23/5256; H01L 29/41741; H01L 29/7802; H01L 29/7813; H01L 29/7827; H01L 29/7395
USPC ......... 257/209, 341, 401, E29.027, E29.066, 257/E29.26, E21.435, 173, 529, 48, 50, 257/179, 620, 665, 797, E21.532; 438/132, 251, 281, 333, 467, 601, 438/FOR. 433
See application file for complete search history.

(56) References Cited

U.S. PATENT DOCUMENTS

| | | | |
|---|---|---|---|
| 4,742,425 A | | 5/1988 | Conzelmann et al. |
| 4,922,371 A | | 5/1990 | Gray et al. |
| 4,970,686 A | * | 11/1990 | Naruke ............... G11C 17/12 257/529 |
| 5,021,861 A | * | 6/1991 | Baliga ........................ 257/529 |
| 5,055,896 A | | 10/1991 | Williams et al. |
| 5,072,266 A | | 12/1991 | Bulucea et al. |
| 5,321,289 A | | 6/1994 | Baba et al. |
| 5,416,351 A | | 5/1995 | Ito et al. |
| 5,430,315 A | | 7/1995 | Rumennik |
| 5,468,667 A | | 11/1995 | Diaz et al. |
| 5,502,320 A | | 3/1996 | Yamada |
| 5,519,242 A | | 5/1996 | Avery |
| 5,567,634 A | | 10/1996 | Hebert et al. |
| 5,637,898 A | | 6/1997 | Baliga |
| 5,637,900 A | | 6/1997 | Ker et al. |
| 5,648,283 A | | 7/1997 | Tsang et al. |
| 5,661,322 A | | 8/1997 | Williams et al. |

(Continued)

FOREIGN PATENT DOCUMENTS

| | | |
|---|---|---|
| DE | 19926107 | 11/2000 |
| DE | 10358324 | 7/2005 |

(Continued)

*Primary Examiner* — Marcos D. Pizarro
*Assistant Examiner* — Sue Tang

(57) ABSTRACT

A self repairing field effect transistor (FET) device, in accordance with one embodiment, includes a plurality of FET cells each having a fuse link. The fuse links are adapted to blow during a high current event in a corresponding cell.

16 Claims, 16 Drawing Sheets

(56) References Cited

U.S. PATENT DOCUMENTS

| | | | |
|---|---|---|---|
| 5,661,323 A * | 8/1997 | Choi | H01L 23/5256 257/378 |
| 5,763,914 A * | 6/1998 | Hshieh et al. | 257/329 |
| 5,850,095 A | 12/1998 | Chen et al. | |
| 5,914,524 A * | 6/1999 | Komenaka | H01L 23/5256 257/209 |
| 5,998,833 A | 12/1999 | Baliga | |
| 5,998,836 A | 12/1999 | Williams | |
| 5,998,837 A | 12/1999 | Williams | |
| 6,044,018 A | 3/2000 | Sung et al. | |
| 6,046,470 A | 4/2000 | Williams et al. | |
| 6,049,108 A | 4/2000 | Williams et al. | |
| 6,078,090 A | 6/2000 | Williams et al. | |
| 6,140,678 A | 10/2000 | Grabowski et al. | |
| 6,168,996 B1 | 1/2001 | Numazawa et al. | |
| 6,211,018 B1 | 4/2001 | Nam et al. | |
| 6,218,279 B1 * | 4/2001 | Weber | H01L 23/5256 257/E23.149 |
| 6,255,683 B1 | 7/2001 | Radens et al. | |
| 6,268,242 B1 | 7/2001 | Williams et al. | |
| 6,277,695 B1 | 8/2001 | Williams et al. | |
| 6,347,026 B1 | 2/2002 | Sung et al. | |
| 6,365,462 B2 | 4/2002 | Baliga | |
| 6,365,941 B1 | 4/2002 | Rhee | |
| 6,391,721 B2 | 5/2002 | Nakagawa | |
| 6,413,822 B2 | 7/2002 | Williams et al. | |
| 6,514,839 B1 | 2/2003 | Ker et al. | |
| 6,548,860 B1 | 4/2003 | Hshieh et al. | |
| 6,631,060 B2 | 10/2003 | Su et al. | |
| 6,642,109 B2 | 11/2003 | Lee et al. | |
| 6,645,802 B1 | 11/2003 | Li et al. | |
| 6,661,054 B1 | 12/2003 | Nakamura | |
| 6,680,833 B2 | 1/2004 | Morishita | |
| 6,700,158 B1 | 3/2004 | Cao et al. | |
| 6,855,593 B2 | 2/2005 | Andoh et al. | |
| 6,861,701 B2 | 3/2005 | Williams et al. | |
| 6,919,603 B2 | 7/2005 | Brodsky et al. | |
| 6,927,455 B2 | 8/2005 | Narazaki | |
| 7,019,368 B1 | 3/2006 | McCollum et al. | |
| 7,419,878 B2 | 9/2008 | Williams et al. | |
| 7,482,218 B1 | 1/2009 | McCollum et al. | |
| 7,544,545 B2 | 6/2009 | Chen et al. | |
| 7,616,416 B2 * | 11/2009 | Chung et al. | 361/56 |
| 8,183,629 B2 | 5/2012 | Pattanayak et al. | |
| 8,368,126 B2 | 2/2013 | Pattanayak et al. | |
| 8,471,390 B2 | 6/2013 | Wong et al. | |
| 8,697,571 B2 | 4/2014 | Wong et al. | |
| 8,883,580 B2 | 11/2014 | Pattanayak et al. | |
| 2002/0074585 A1 | 6/2002 | Tsang et al. | |
| 2002/0084508 A1 | 7/2002 | Le et al. | |
| 2002/0182838 A1 * | 12/2002 | Park | 438/601 |
| 2003/0030092 A1 | 2/2003 | Darwish et al. | |
| 2003/0071310 A1 | 4/2003 | Salling et al. | |
| 2004/0075145 A1 | 4/2004 | Shibib | |
| 2004/0124472 A1 | 7/2004 | Lin et al. | |
| 2004/0179412 A1 * | 9/2004 | Lehmann | G11C 29/812 365/200 |
| 2004/0217418 A1 * | 11/2004 | Imam | H01L 29/7813 257/341 |
| 2004/0217441 A1 * | 11/2004 | Lehmann | H01L 23/5252 257/530 |
| 2005/0036251 A1 | 2/2005 | Mallikarjunaswamy et al. | |
| 2005/0116282 A1 * | 6/2005 | Pattanayak | H01L 29/7813 257/327 |
| 2005/0157571 A1 | 7/2005 | Schaffer | |
| 2006/0049466 A1 | 3/2006 | Egawa et al. | |
| 2006/0267669 A1 | 11/2006 | Robinson et al. | |
| 2006/0268479 A1 | 11/2006 | Bischof | |
| 2006/0285414 A1 * | 12/2006 | Kimura | 365/225.7 |
| 2007/0171691 A1 * | 7/2007 | Ashizawa | G11C 17/16 365/96 |
| 2007/0181969 A1 * | 8/2007 | Kim | H01L 23/5256 257/529 |
| 2007/0216514 A1 * | 9/2007 | Ohtsuka et al. | 337/404 |

FOREIGN PATENT DOCUMENTS

| | | |
|---|---|---|
| EP | 0620588 A2 | 10/1994 |
| EP | 1186023 A1 | 3/2002 |
| EP | 1351313 A2 | 10/2003 |
| EP | 1403914 A2 | 3/2004 |
| JP | S62-279677 | 3/1987 |
| JP | 1248564 | 3/1988 |
| JP | 01-248564 | 4/1989 |
| JP | H06-350090 | 12/1994 |
| JP | H09-129877 | 5/1997 |
| JP | H10294456 | 11/1998 |
| JP | 2000091344 A | 3/2000 |
| JP | 2001-024063 | 1/2001 |
| JP | 2001024063 | 1/2001 |
| JP | 2001-177093 | 6/2001 |
| JP | 2001177093 | 6/2001 |
| JP | 2001248564 | 9/2001 |
| JP | 20020016080 A | 1/2002 |
| JP | 20020110978 A | 4/2002 |
| JP | 2002246596 A | 8/2002 |
| JP | 2002-368221 | 12/2002 |
| JP | 2003501835 | 1/2003 |
| JP | 2004134793 A | 4/2004 |
| JP | 2004186590 | 7/2004 |
| JP | 2004289103 | 10/2004 |
| JP | 2005136060 | 5/2005 |
| JP | 2007019264 A | 1/2007 |
| JP | 2009129877 A2 | 6/2009 |
| KR | 1020060047944 | 5/2006 |
| WO | 0065646 A1 | 11/2000 |
| WO | 0199177 A2 | 12/2001 |

* cited by examiner

US 10,600,902 B2

SELF-REPAIRING FIELD EFFECT TRANSISITOR

BACKGROUND OF THE INVENTION

As semiconductor fabrication technology continues to progress, devices such as field effect transistors (FET) continue to get smaller and less expensive. The design and layout for such devices are constrained by technology specific minimum sizes, spacings, alignments and overlaps of the various structures of the device and the fabrication means. During manufacturing a percentage of the devices are defective due to process variations.

A typical power MOSFET device may have thousands or millions of parallel MOSFET cells. The large number of parallel linked cells enable the device to handle high current and have a low on resistance. Generally, the higher the current carrying capability of the device, the high the number of cells there are in the device. When a single cell in the device is defective, such as a gate-to-source or source-to-drain short, the defect typically damages the entire device. Therefore, when one cell is defective, the whole device has to be discarded, reducing the manufacturing yield. The massive parallel cell structure also makes it difficult to screen the devices. In particular, non-catastrophic defects between source-to-gate and drain-to-gate are not easily detectable. The non-catastrophic device may therefore cause reliability issued with the device and/or the electronics in which it is utilized.

SUMMARY OF THE INVENTION

Embodiments of the present invention are directed toward self-repairing transistors. In one embodiment, a field effect transistor WET) device includes a plurality of FET cells. A dielectric layer is disposed between the plurality of cells and the source interconnect of the device. A source contact of each cell is coupled to the source interconnect by a corresponding source fuse link.

In another embodiment, an integrated circuit (IC) includes a drain region, a gate region, a plurality of source regions, a plurality of body regions and a plurality of gate insulator regions. The gate region is disposed above the drain region, wherein a first portion of the gate region is formed as a first plurality of substantially parallel elongated structures and a second portion of the gate region is formed as a second plurality of substantially parallel elongated structures that are perpendicular to the first plurality of substantially parallel elongated structures. The plurality of source regions are disposed proximate a periphery of the gate region within each cell defined by the first and second plurality of substantially parallel elongated structures. The plurality of body regions are disposed between the drain region and the source region within each cell. The gate insulator region is disposed between the gate region and the plurality of source regions, between the gate region and the plurality of body regions and between the gate region and the drain region. The (IC) also includes a plurality of source contacts, a source interconnect, and a plurality of source fuse links. The plurality of source contacts are each coupled to a corresponding source region. The source fuse links couple corresponding source contacts to the source interconnect.

In yet another embodiment, a method of fabricating a field effect transistor device includes forming a plurality of field effect transistor cells, wherein each cell includes a source region. The method also includes forming a plurality of source contacts, a plurality of source fuse links and a source interconnect. Each given source contact is coupled to a corresponding source region. Each source fuse link is coupled to a corresponding source contact. The source interconnect is coupled to the plurality of source fuse links.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, die invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Embodiments of the present invention include self-repairing field effect transistors (FET) and methods of manufacturing the same. In particular, a fuse is added to each individual cell of FET devices having massively parallel cell structures. When a cell is defective, excessive current through the cell will brown up the cell, automatically disabling the defective cell. The fuse may be vertically aligned with the cell and therefore will not substantially increase the surface area of the cell. The FET devices may be MOSFETs, JFETs or the like. Furthermore, the FET devices may have a vertical or planar topology.

It is appreciated that FET devices are substantially symmetrical. In particular, the source and drains of the FET devices may generally be swapped. Therefore, it is to be understood that the use of the term "source" herein is also equivalent to "drain" when the source and drains are interchanged.

Figure 1:
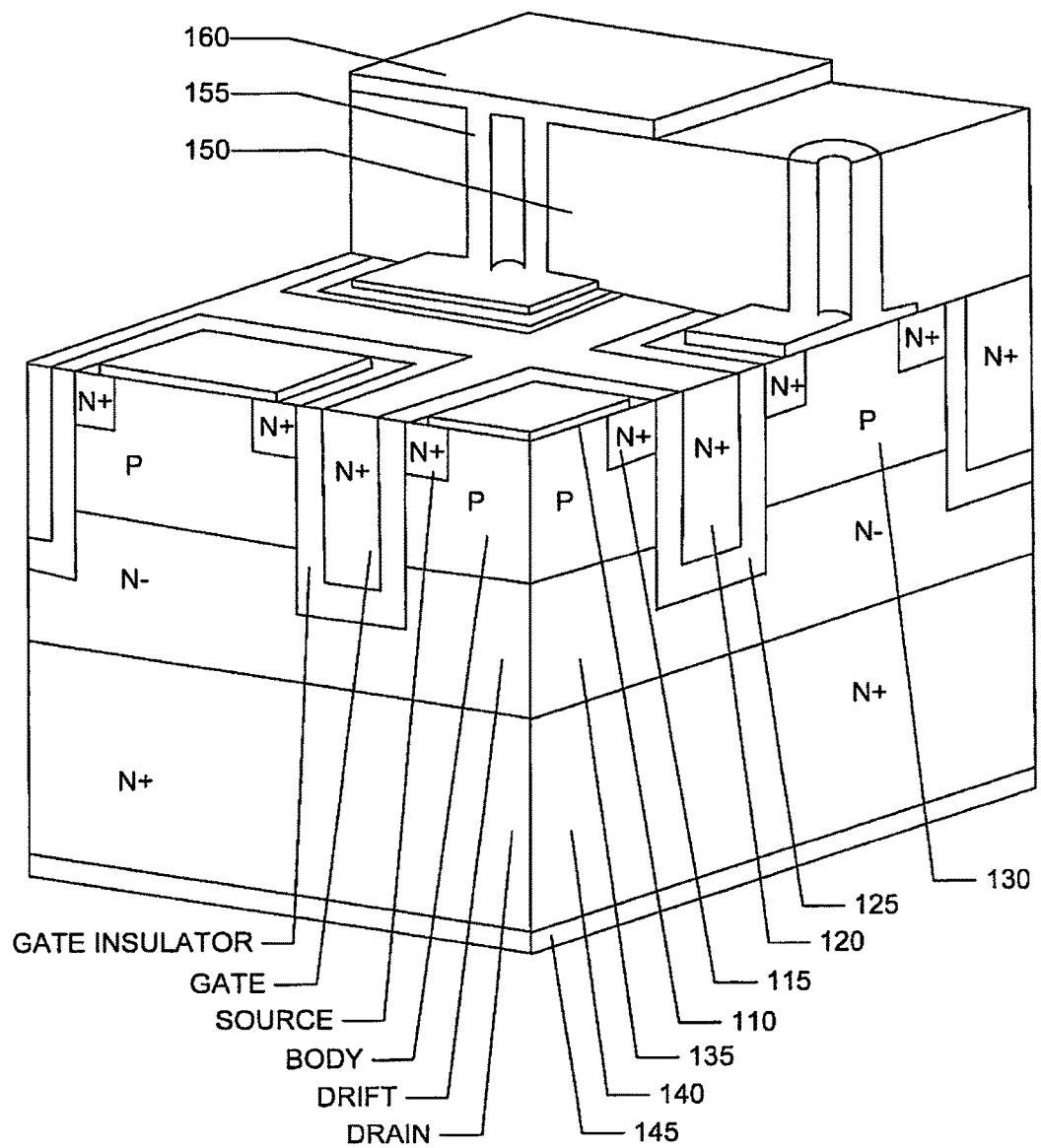
FIG. 1 shows a sectional view of an exemplary trench metal-oxide-semiconductor field effect transistor (TMOSFET) device, in accordance with one embodiment of the present technology.

Referring to FIG. 1, an exemplary vertical trench metal-oxide-semiconductor field effect transistor (TMOSFET) device 100, in accordance with one embodiment of the present technology, is shown. As illustrated, the FET may be a closed cell trench metal-oxide-semiconductor field effect transistor (TMOSFET). The closed cell TMOSFET 100 includes a plurality of vertical MOSFET cells, wherein each cell includes a source region, a body region, a gate region, and a drain region. The vertical MOSFET cells are coupled in parallel with each other.

The MOSFET device may include a plurality of source/body contacts 110, a plurality of source regions 115, a gate region 120, a gate insulator region 125, a plurality of body regions 130, a drain region 135, 140 and a drain interconnect 145. The drain region 135, 140 may optionally include a first drain portion 140 usually referred to as a drift region, and a second drain portion 135 usually referred to as the drain region. The MOSFET device also includes an encapsulation layer 150, a plurality of source fuse links 155, and a source interconnect 160.

The body regions 130, the source regions 115, the gate region 120 and the gate insulator region 125 are disposed above the drain region 135, 140. A first portion of the gate region 120 and the gate insulator region 125 is formed as substantially parallel-elongated structures 121. A second portion of the gate region 120 and the gate insulation region 125 is formed as substantially normal-to-parallel elongated structures 122. The first and second portions of the gate region 120 are all interconnected and form the plurality of cells. The body regions 130 are disposed within the plurality of cells formed by the gate region 120. The gate insulator region 125 surrounds the gate region 120. Thus, the gate region 120 is electrically isolated from the surrounding regions by the gate insulator region 125. The source regions 115 are formed in The plurality of cells, along the periphery of the gate insulator region 125.

In one implementation, the source regions 115 and the drain region 140 are heavily n-doped (+N) semiconductor, such as silicon doped with phosphorous or arsenic. The body regions 130 are p-doped (P) semiconductor, such as silicon doped with boron. The gate region 120 is heavily n-doped semiconductor (N+), such as polysilicon doped with phosphorous. The gate insulator region 125 may be an insulator, such as silicon dioxide.

A source/body contact 110 is coupled to the source region 115 and the body region 130 of each cell. Thus, the source/body contact 110 couples the source region 115 to the body region 130 of each cell. The encapsulation layer is disposed between the gate region 120, the source region 115, the source/body contacts 110, the source fuse links 155, and the source interconnect 160. The source fuse links 155 are disposed between the source/body contacts 110 and the source interconnect 160. The source interconnect 160 couples the plurality of source regions 115 to form a common source of the device. The source fuse links 155 vertically extend from the source/body contacts 115, on top of each individual cell, and therefore do not consume additional lateral surface area in the device 100.

When the potential of the gate region 120, with respect to the source regions 115, is increased above the threshold voltage of the device 100, a conducting channel is induced in the body region 130 along the periphery of the gate insulator region 125. The device 100 will then conduct current between the drain region 140 and the source regions 115. Accordingly, the device 100 is in its on state.

When the potential of the gate region 120 is reduced below the threshold voltage, the channel is no longer induced. As a result, a voltage potential applied between the drain region 140 and the source regions 115 will not cause current to flow there between. Accordingly, the device is in its off state and the junction formed by the body region 130 and the drain region 140 supports the voltage applied across the source and drain.

If the drain region 135, 140 comprises a second portion 135 disposed above a first portion 140, the second portion of the drain region 135 is lightly n-doped (N−) semiconductor, such as silicon doped with phosphorous or arsenic, and the first portion of the drain region 140 is heavily n-doped (N+) semiconductor, such as silicon doped with phosphorous. The lightly n-doped (N−) second portion of the drain region 135 results in a depletion region that extends into both the body regions 130 and the second portion of the drain region 135, thereby reducing the punch through effect. Accordingly, the lightly n-doped (N−) second portion of the drain region 135 acts to increase the breakdown voltage of the closed cell TMOSFET 200.

The channel width of the closed cell TMOSFET 100 is a function of the slim of the width of the source regions 115. Accordingly, the closed cell TMOSFET 100 has a relatively low channel resistance (e.g., drain-to-source on resistance $R_{ds-on}$). The low channel resistance reduces power dissipated in the closed cell TMOSFET 100. Similarly, the gate-to-drain capacitance of the closed cell TMOSFET 120 is a function of the area of overlap between the bottom of the gate region 120 and the drain region 140.

In one implementation, the encapsulant 150 may be a dielectric, such as but not limited to BPSG. The source/body contacts 110 may be made of a high melting point metal, such as but not limited to tantalum, titanium, tungsten, titanium nitride, tantalum nitride, and/or titanium silicide. The source fuse link 155 may be made of a low melting point metal, such as but not limited to copper, aluminum, bismuth, indium and/or tin. The source interconnect 160 may be made of a high or low melting point metal or a combination thereof.

In one implementation, the source fuse links 155 may be substantially solid. When a relatively high current flows through the source of a given cell, heat will be concentrated in the corresponding source fuse link. The heat melts the metal of the given fuse link and causes localized melting of the surrounding encapsulant 150. The localized melting of the surrounding encapsulant forms a void into which the low melting point metal of the source fuse link will flow, thereby creating a break in the source fuse link. When a break in the source fuse link develops the fuse is "blown" and the high current path through the cell is broken.

Figure 2:
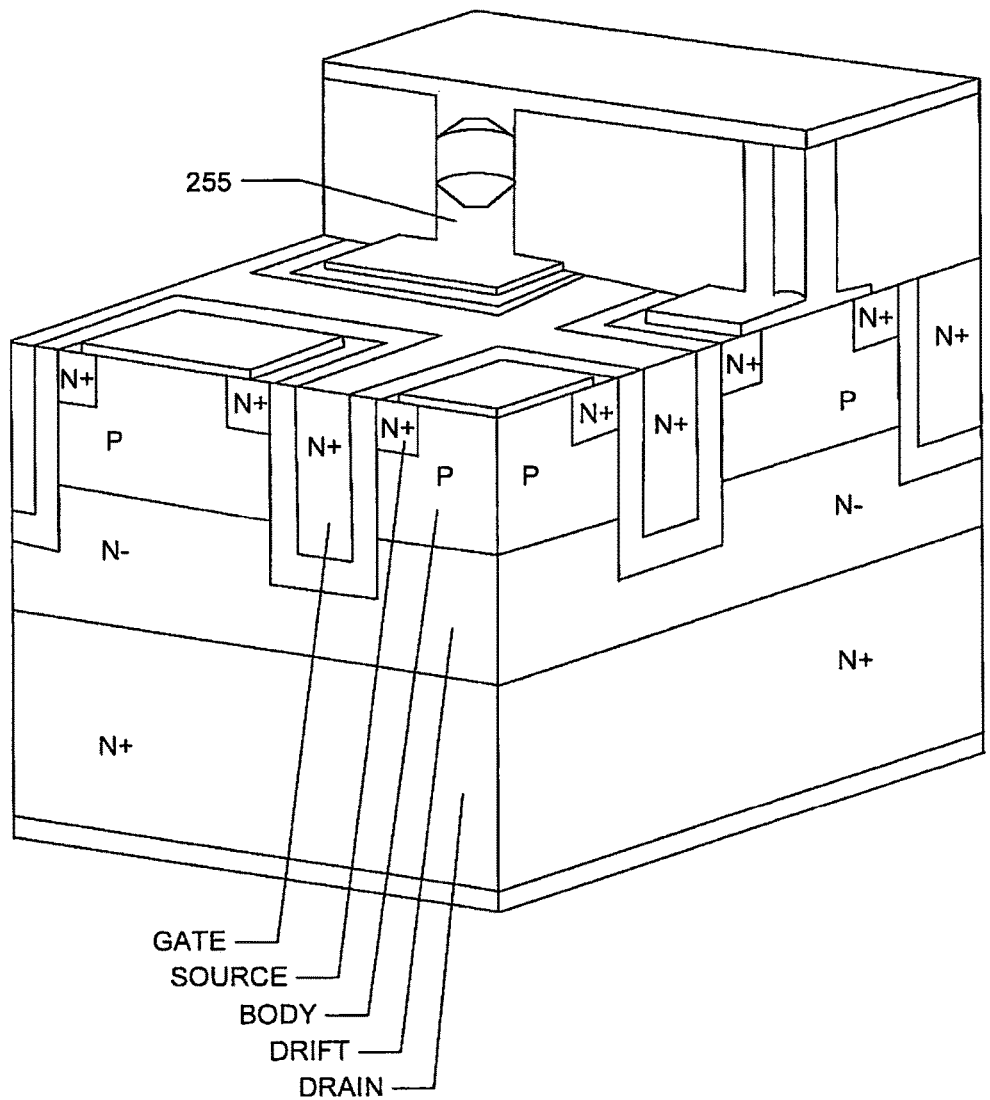
FIG. 2 shows a sectional view of the exemplary TMOSFET device with a source fuse link blown, in accordance with one embodiment of the present technology.

In another implementation, the source fuse links 155 may each contain a cavity, as illustrated in FIG. 1. The cavity may substantially extend the length of the source fuse link 155 or a just a portion of the length of the source fuse link 155. When a relatively high current flows through the source of a given cell, heat will be concentrated in the cavity. The heat melts the metal of the given fuse link 255 causing it to flow into the cavity and creating a break in the source fuse link 255, as illustrated in FIG. 2. When a break in the source fuse link 255 develops the fuse if "blown" and the high current path through the cell is broken. In addition to or alternatively to the metal of the source fuse link melting, the high current may cause electromigration of the metal in the source fuse link. The electromigration, alone or in combination with thermal melting of the source fuse link metal, may cause the fuse link to blow.

Each fuse link 255 is constructed to be blown before the corresponding cell damages other cells. A typical MOSFET cell carries about 0.1 mA in direct current mode (DC mode) and 0.5 mA in pulse mode. When a given cell is defective and there is a high current path (e.g. short) between the gate-to-source, gate-to-drain or source-to-drain the in rush current in the give cell will get progressively larger, typically reaching 10-100 mA. The fuse links are constructed to be blown before the corresponding cell reaches this high current level, preventing damage to the rest of the cells in the device. Accordingly, the defective cell is disabled and the rest of the cells remain functional. The device is thus self-repairing with little or no performance degradation.

Figure 3:
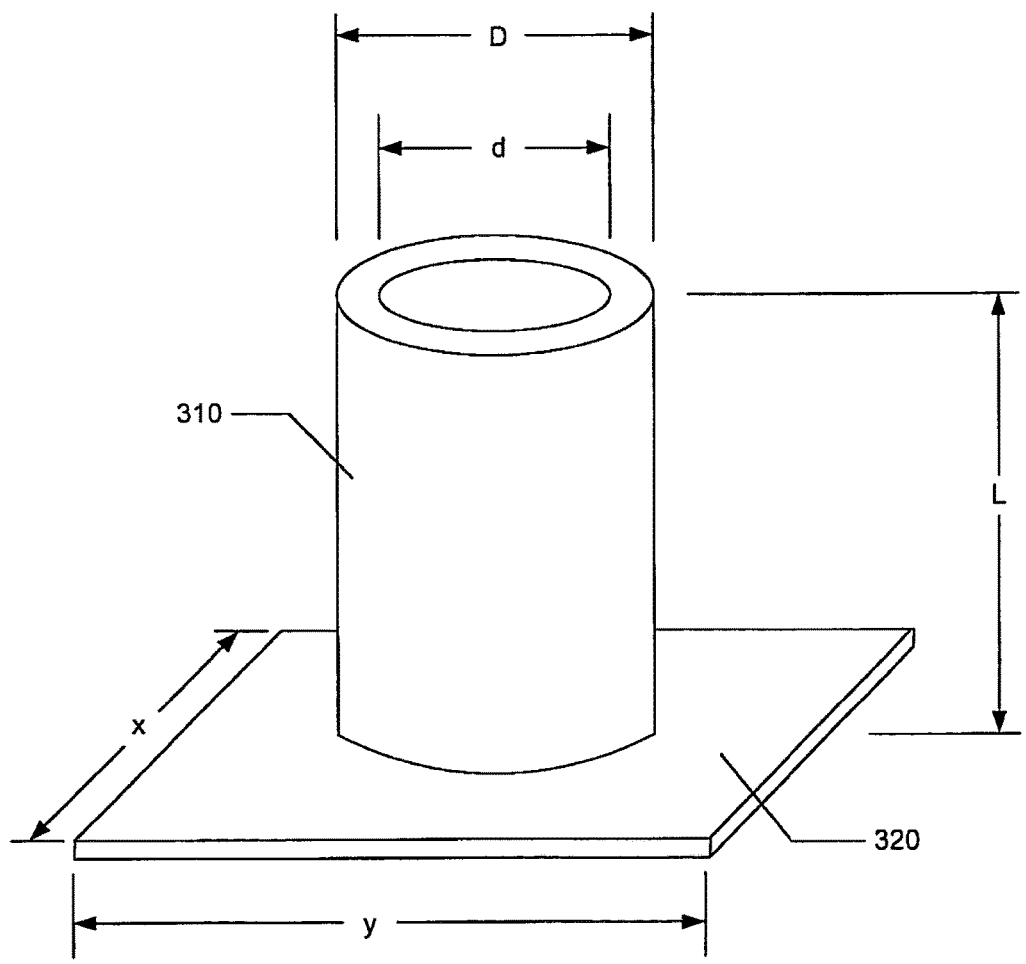
FIG. 3 shows sectional view of an exemplary source fuse link, in accordance with one embodiment of the present technology.

Referring now to FIG. 3, an exemplary source fuse link, in accordance with one embodiment of the present technology, is shown. The source fuse link 310 may have a height of L, an inside diameter of d and an outside diameter of D. The source fuse rink may be formed on a source/body contact 320 that is x by y. In one implementation, the source/body contact may have a dimension of x=y=2.5 um. In one implementation, the source fuse link may be aluminum. Aluminum is characterized by the following parameters: density (solid) 2698 kg/m3; density (liquid) 2400 kg/m3; melting point 933.5 K; boiling point 2740 K; enthalpy of fusion 10.67 KJ/mole; enthalpy of evaporation 293.72 KJ/mole; resistivity (solid) 2.66E-08 Ohm M; heat capacity (solid) 24.35 J K/mole; and molar mass 26.98 g.

In an exemplary implementation, for a FET device having a source fuse link, it is assumed that no heat is lost to the surroundings, that the head capacity is constant between room temperature and the melting point. The volume space of the void in the source fuse link 300 is substantially equal to the aluminum volume of the source fuse link 310. The melt energy is assumed to be the sum of heat needed to raise the temperature and the enthalpy of fusion. The number of parallel cells in the exemplary device may be approximate 1,000,000 cells. The chip is assumed to operate at a room temperature of 295 K.

The individual cell fuse link area resistance may be calculated according to equation 1, as follows.

$$r = \rho * L * 4 / [\pi * (D^2 - d^2)] \quad (1)$$

The chip resistance due to the added aluminum fuse may be calculated according to equation 2, as follows:

$$R = r/N \quad (2)$$

wherein N is the number of parallel cells. The energy required to melt one cell fuse may be calculated according to equation 3, as follows:

$$E = \text{Volume} * d * (Cp * \Delta T + \Delta H \text{fusion}) / AW \quad (4)$$

wherein AW is the atomic weight, d is the density, Cp is the molar heat capacity, and $\Delta H$fusion is the enthalpy of fusion. Accordingly, the time required to melt the source fuse link for a cell may be calculated according to equation 4, as follows:

$$t = \frac{E/(RI^2) = \frac{\{L * [\pi * (D^2 - d^2)]/4 * d ** (Cp * \Delta T + \Delta H fusion)/AW}{\{\rho * L * 4/[\pi * (D^2 - d^2)]\} * I^2} = }{\frac{\{[\pi * (D^2 - d^2)]/4\}^2 * d ** (Cp * \Delta T + \Delta H \text{ fusion})}{AW * \rho * I^2}} \quad (5)$$

Figure 4:
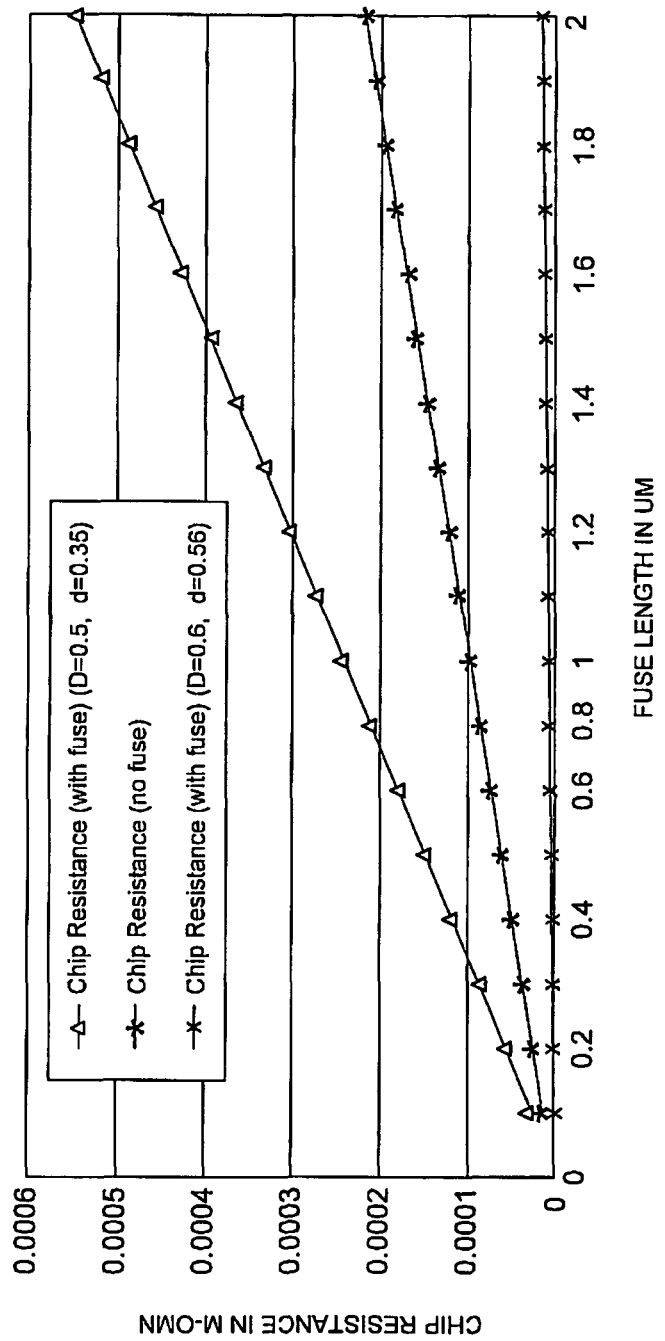
FIG. 4 shows a graph of exemplary chip resistance, in accordance with one embodiment of the present technology.

Referring now to FIG. 4, a graph of exemplary chip resistance, in accordance with one embodiment of the present technology, is shown. The graph compares the chip resistance contribution versus length, from source fuse links having different cross sectional areas against a device without the source fuse link. As depicted in a first plot, the chip resistance for a closed cell TMOSFET without a source Fuse link is substantially constant. The second plot shows the chip resistance contribution of source fuse links that have an inside diameter of 0.35 um and an outside diameter of 0.5 um. The third plot shows the chip resistance contribution of source fuse links that have an inside diameter of 0.56 and an outside diameter of 0.8 um. As illustrated the chip resistance contribution decreases as the cross sectional area of the source fuse link increases. In addition, the chip resistance contribution increases as the fuse length increases. However, for the exemplary source fuse links the chip resistance contribution is in the range of approximately 0.1 u ohm to 1 u ohm.

Figure 5:
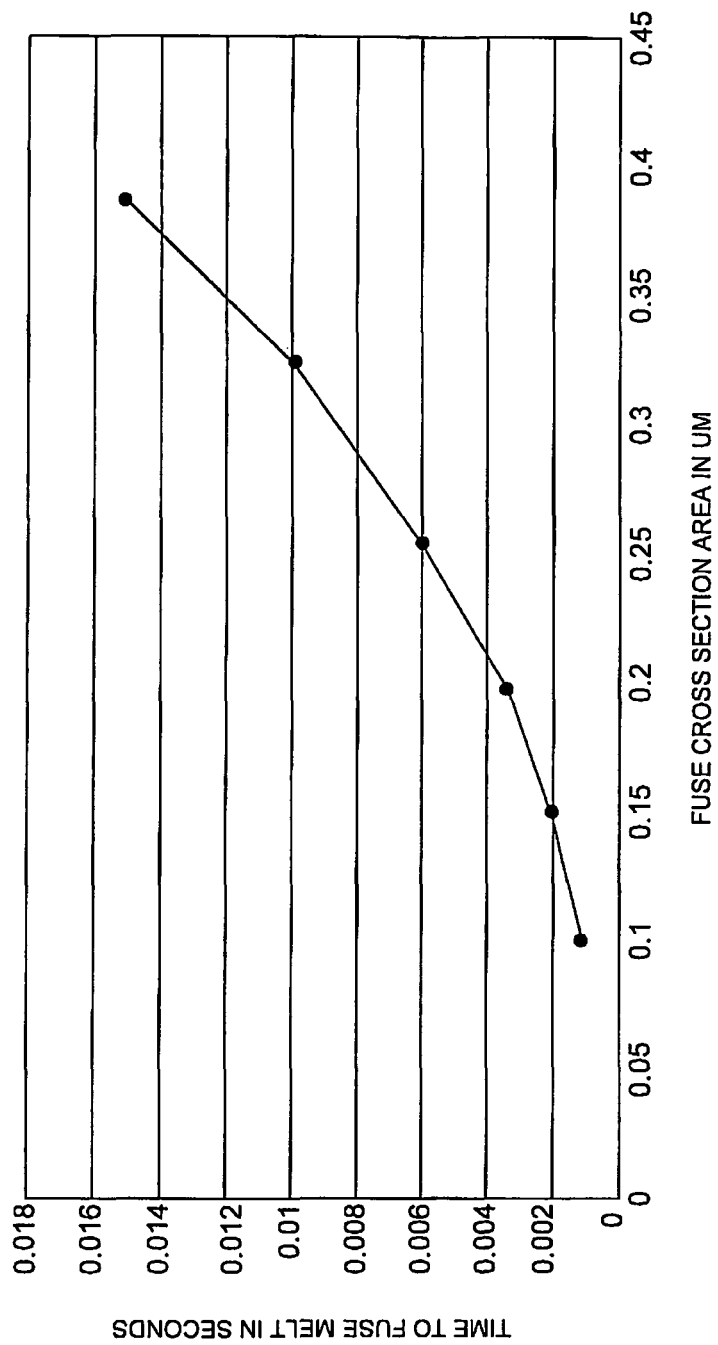
FIG. 5 shows a graph of exemplary times required to melt a source fuse link, in accordance with one embodiment of the present technology.

Referring now to FIG. 5, a graph of exemplary times required to melt a source fuse link, in accordance with one embodiment of the present technology, is shown. The graph compares the time to melt the fuse versus the cross section area of the source fuse link, for a fuse under 1.0 mA steady current. As depicted, the time to melt the fuse increases as the cross sectional area of the fuse increases.

Figure 6A:
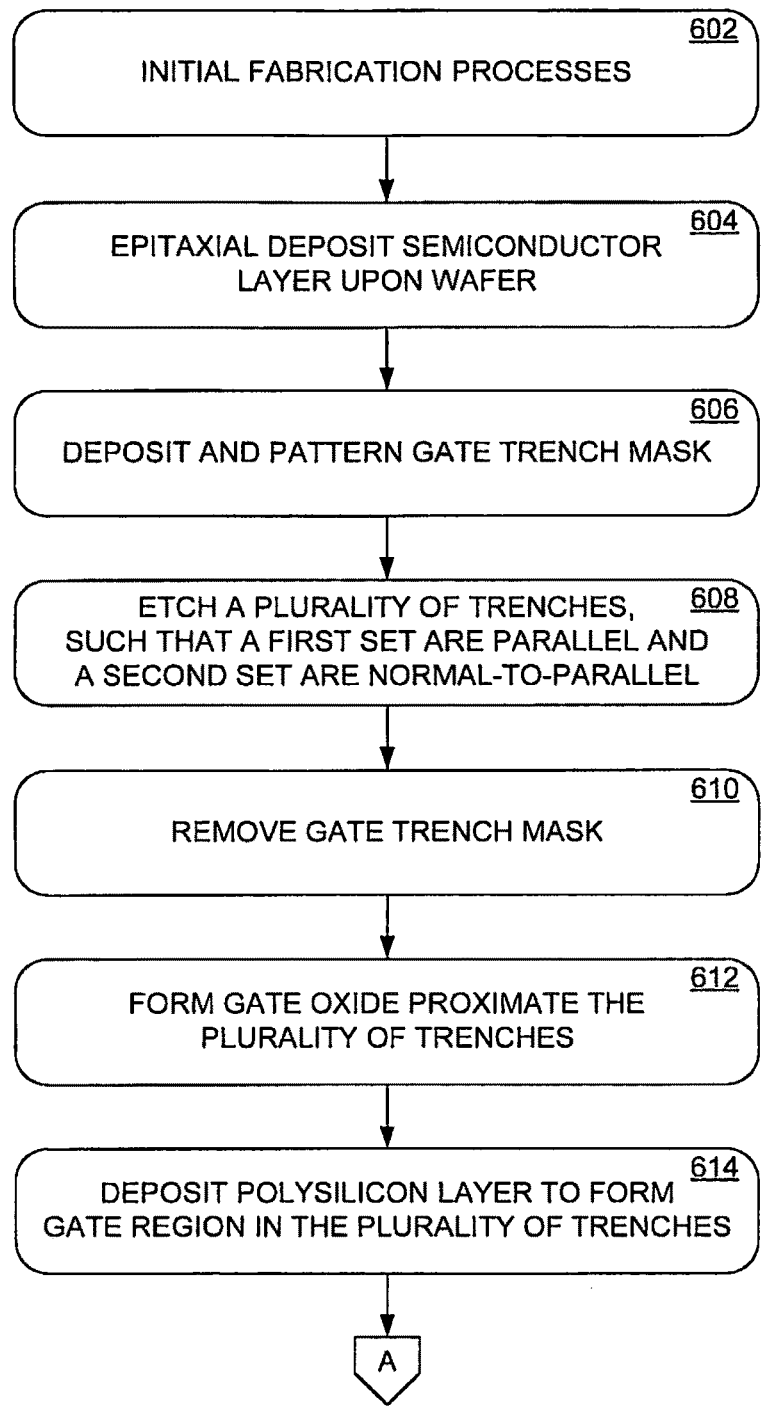
FIGS. 6A-6D show a flow diagram of a method of fabricating a closed cell trench metal-oxide-semiconductor field effect transistor (TMOSFET), in accordance with one embodiment of the present technology.
Figure 6B:
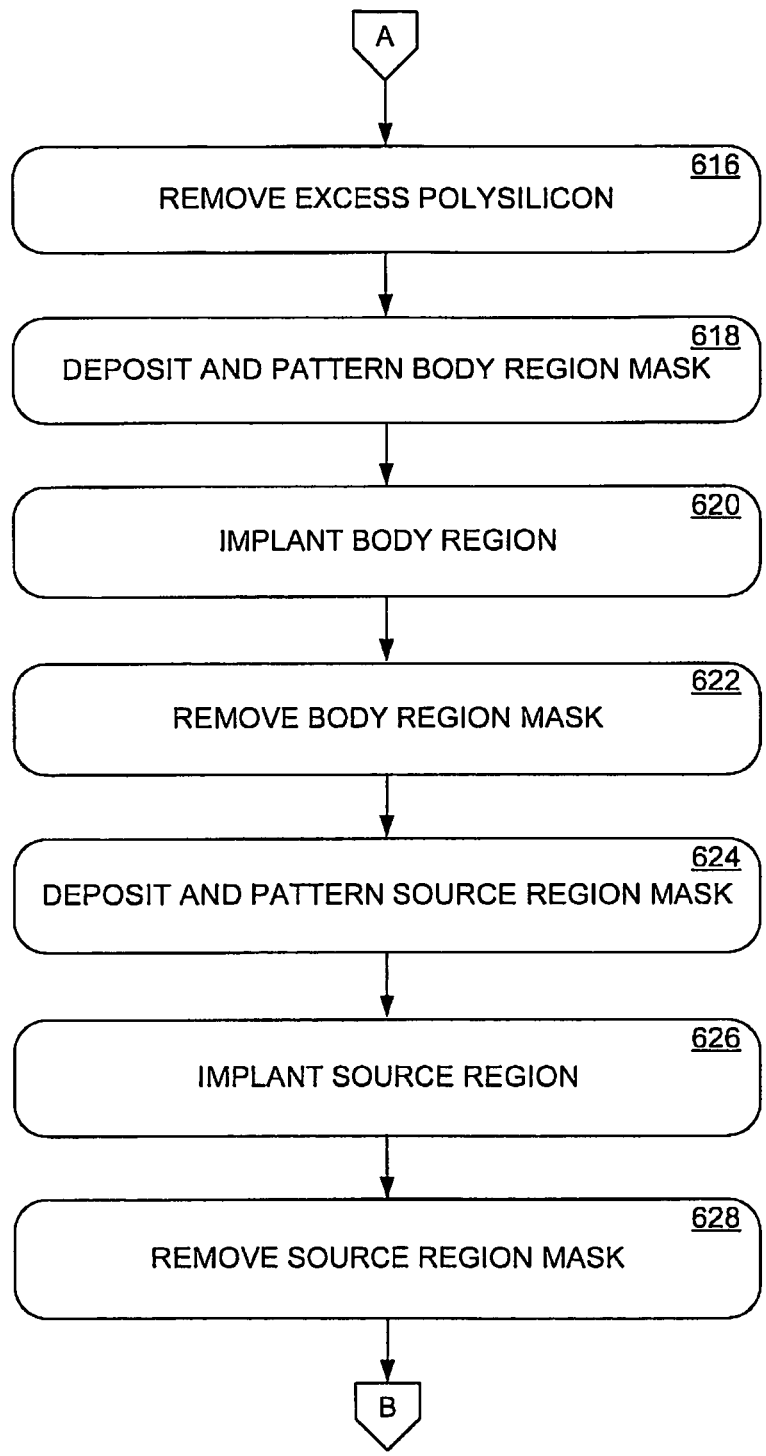
Figure 6C:
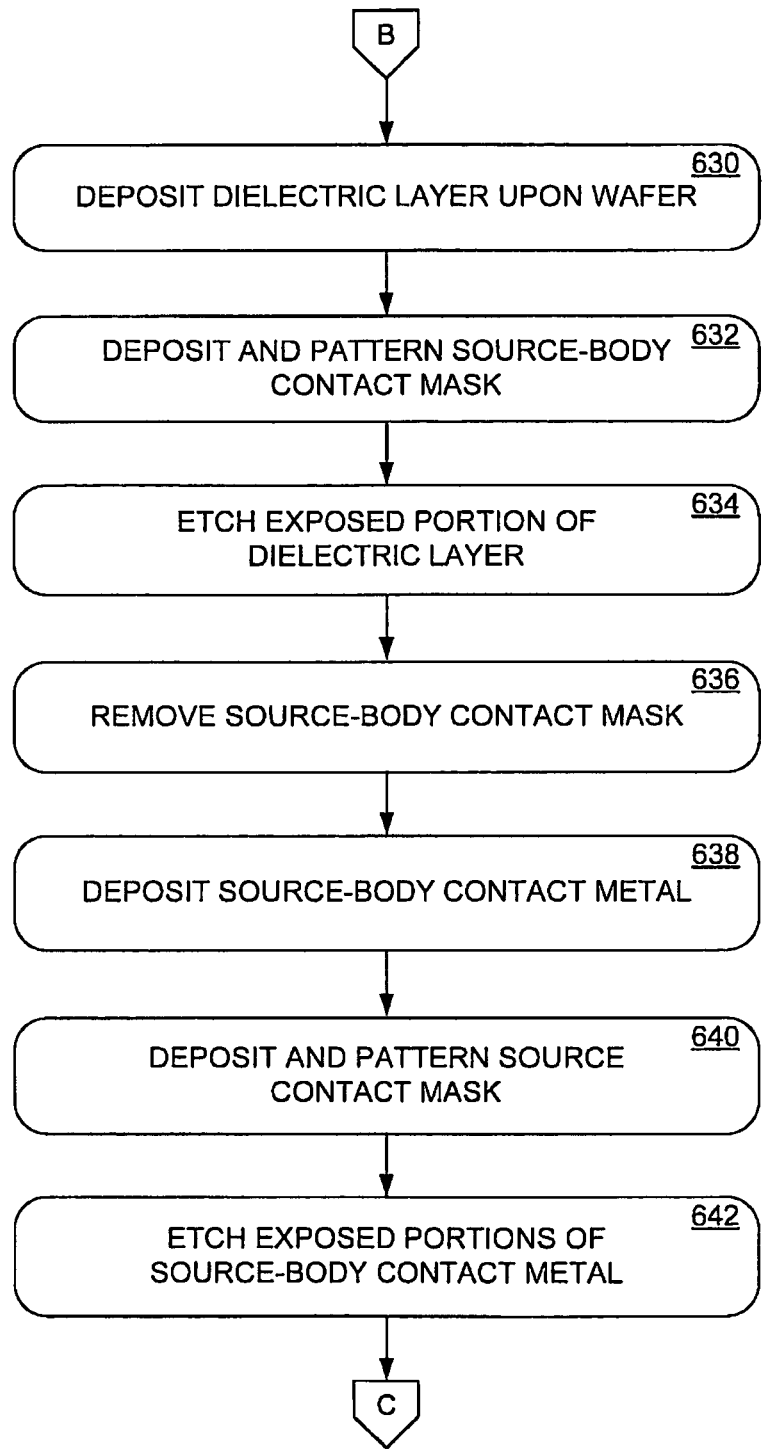
Figure 6D:
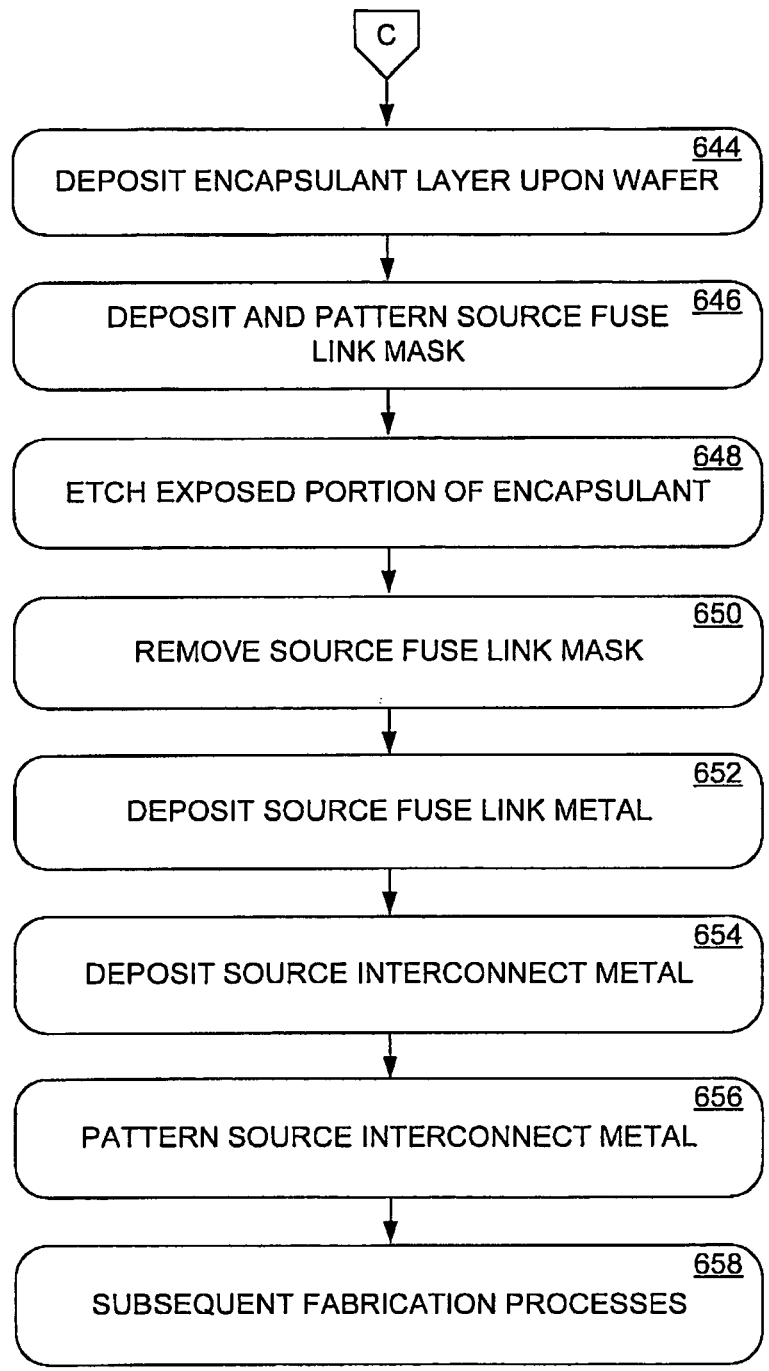
Figure 7A:
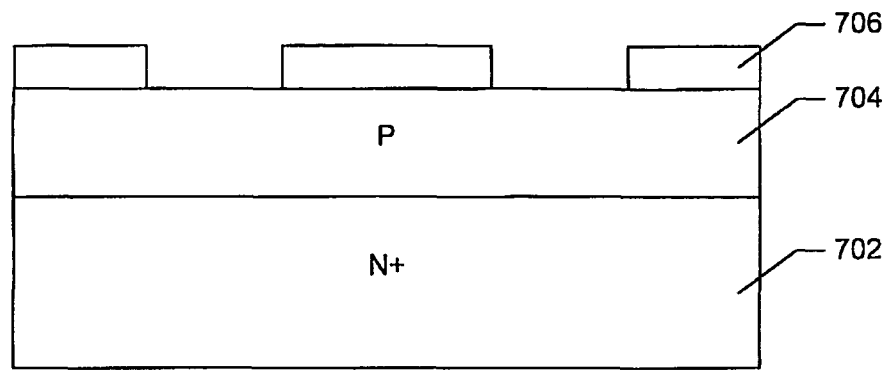
FIGS. 7A-7M show a block diagram illustrating the method of fabricating a closed cell trench metal-oxide-semiconductor field effect transistor (TMOSFET), in accordance with one embodiment of the present technology.

Referring now to FIGS. 6A-6D, a method of fabricating a closed cell trench metal-oxide-semiconductor field effect transistor (TMOSFET), in accordance with one embodiment of the present technology, is shown. The method of fabricating the closed cell TMOSFET, in accordance with one embodiment of the present invention, is illustrated in FIGS. 7A-7M. As depicted in FIGS. 6A and 7A, the process begins, at 602, with various initial processes upon a substrate 702, such as cleaning, depositing, doping, etching and/or the like. The semiconductor substrate 702 may be silicon heavily doped with phosphorous (N+). At 604, a semiconductor layer 704 may be epitaxially deposited upon the substrate 702. In one implementation, the semiconductor layer 704 may be silicon doped with arsenic or boron. The epitaxial deposited silicon 704 may be doped by introducing the desired impurity into the reaction chamber. At 606, a photoresist is deposited and patterned by any-well known lithography process to form a gate trench mask 706.

Figure 7B:
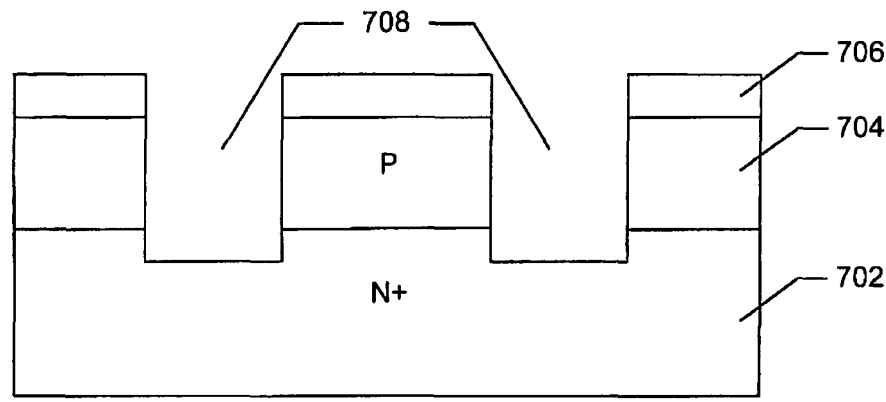

Referring now to FIG. 7B, the exposed portions of the epitaxial deposited semiconductor layer 704 are etched by any-well known isotropic etching method, at 608. In one implementation, an ionic etchant interacts with the epitaxial deposited semiconductor layer exposed by the patterned resist layer 706. A plurality of trenches 708 are formed, such that a first set of trenches are substantially parallel to each other and a second set of trenches (not shown) are substantially normal-to-parallel with respect to the first set of trenches.

Figure 7C:
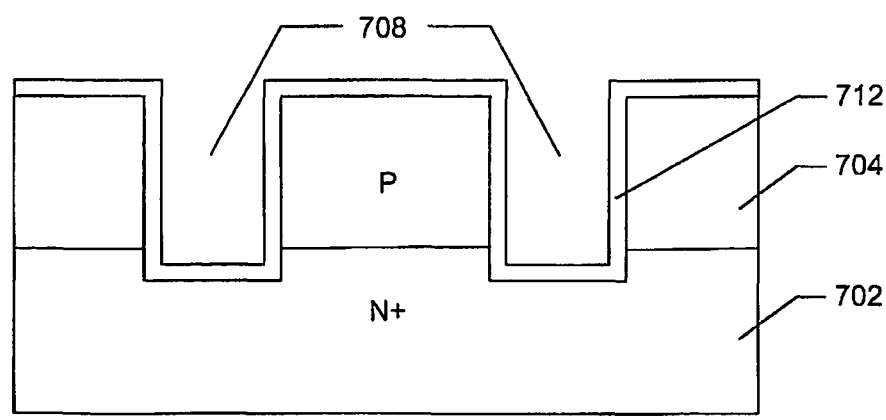

At 610, the gate trench mask 706 is removed utilizing an appropriate resist stripper or a resist ashing process. Referring now to FIG. 7C, a dielectric 712 is formed in the plurality of trenches 708, at 612. In one implementation, the dielectric 712 is formed by oxidizing the surface of the silicon to form a silicon dioxide layer. The resulting dielectric in the trenches forms a first portion of a gate insulator region.

Figure 7D:
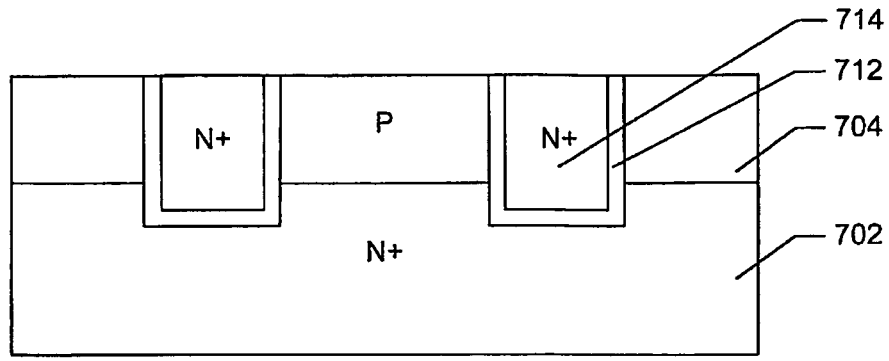

Referring now to FIG. 7D, a polysilicon layer 714 is deposited in the first and second set of trenches to form a gate region, at 614. In one implementation, the polysilicon 714 is deposited in the trenches by a method such as decomposition of silane ($SiH_4$). The polysilicon is doped with n-type impurity such as phosphorous or arsenic. The polysilicon 714 may be doped by introducing the impurity during the deposition process. At 616, an etch-back process is performed to remove excess polysilicon on the surface of the wafer. In one implementation, the excess polysilicon is removed by a chemical mechanical polishing (CMP) process.

Figure 7E:
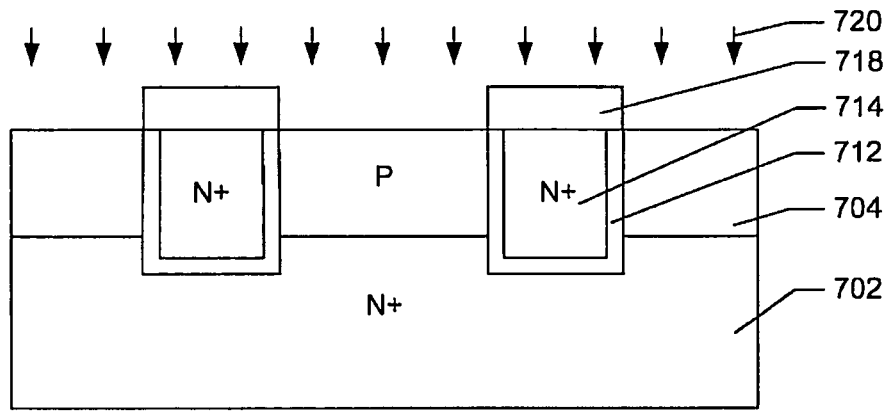

Referring now to FIG. 7E, a second photo-resist is deposited and patterned to form a body region mask, at 618. The body region mask corresponds to the plurality of cells defined by the area inside the gate region. At 620, the exposed portion of the epitaxial deposited semiconductor layer is doped 704 to adjust the doping of the body regions 704 in the plurality of cells. In one implementation, the doping process implants a p-type impurity, such as boron or arsenic, in the epitaxial deposited semiconductor layer 704. A high temperature thermal cycle may be utilized to drive in the body region doping. At 622, the body region mask is removed.

Figure 7F:
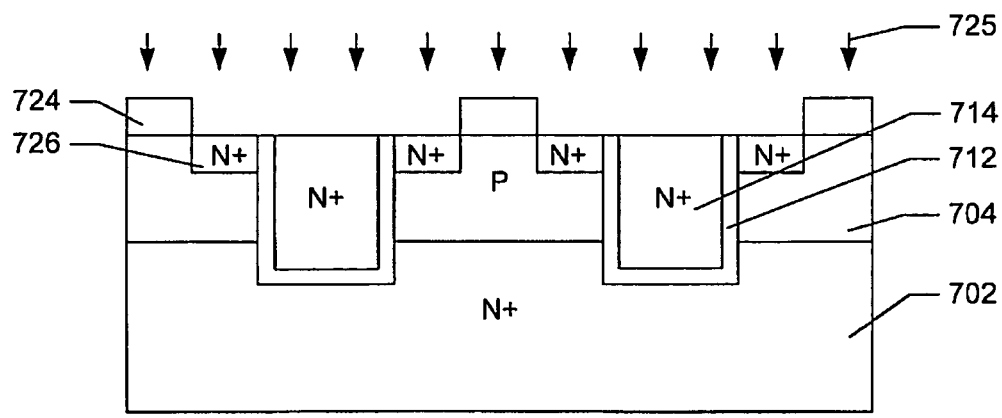

Referring now to FIG. 7f, a third photo-resist is deposited and patterned to form a source region mask, at 624. The source region mask defines a source region in each cell adjacent the gate oxide region. At 626, the portion of the first semiconductor layer, left exposed by the source region mask 724, is doped 725 to form source regions 726. In one implementation, the doping process comprises heavily implanting an n-type impurity, such as phosphorous, into the plurality of cells adjacent the gate oxide region 712. A high temperature thermal cycle may be utilized to drive in the source region doping. At 628, the source region mask is removed.

Figure 7G:
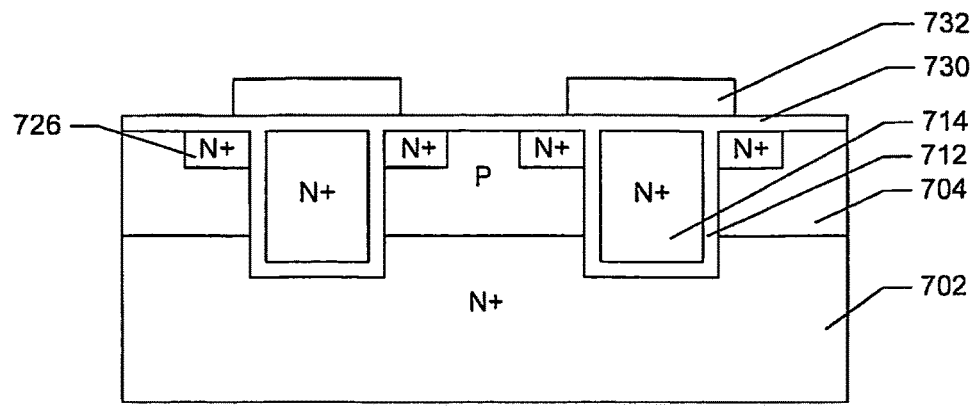
Figure 7H:
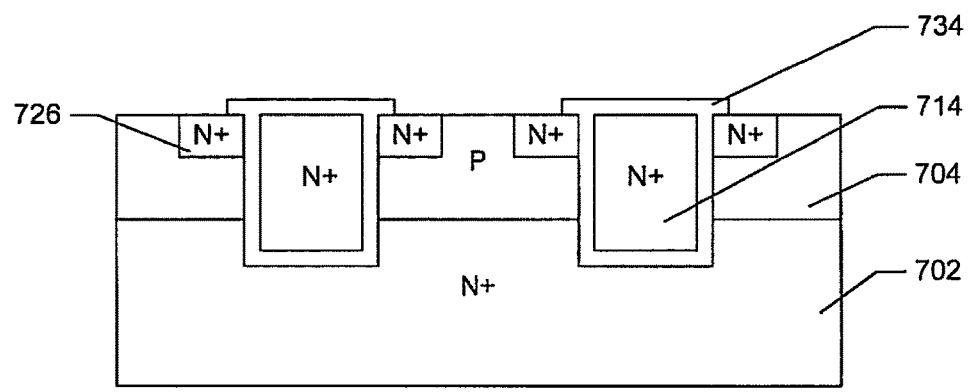

Referring now to FIG. 7G, a dielectric layer 730 is deposited upon the wafer, at 630. In one implementation, the dielectric layer 730 is deposited by decomposition of tetra-ethylortliosilicate (TEOS) in a chemical vapor deposition (CVD) system. At 632, a fourth photo-resist layer is deposited and patterned to define a source/body contact mask 732 above each cell. Referring now to FIG. 7H, the portion of the dielectric layer 730 left exposed by the source/body contact mask 732 is etched to form the gate insulator layer 734, at 634. The source/body contact mask is removed, at 636.

Figure 7I:
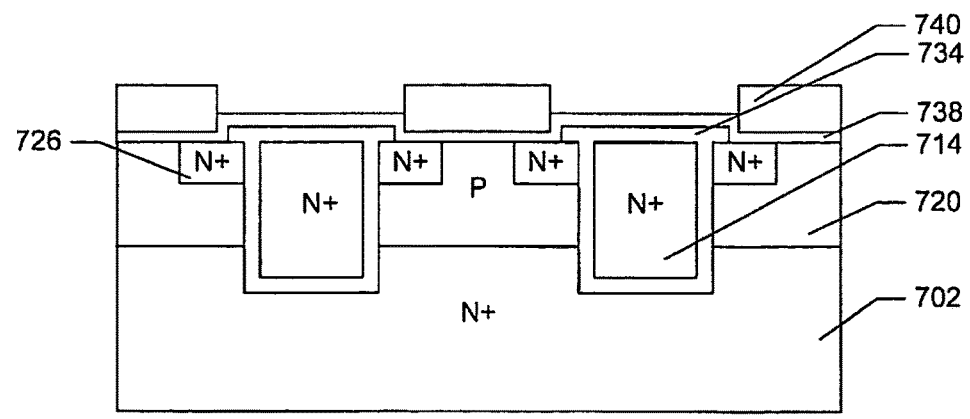
Figures 7J, 7K, 7L:
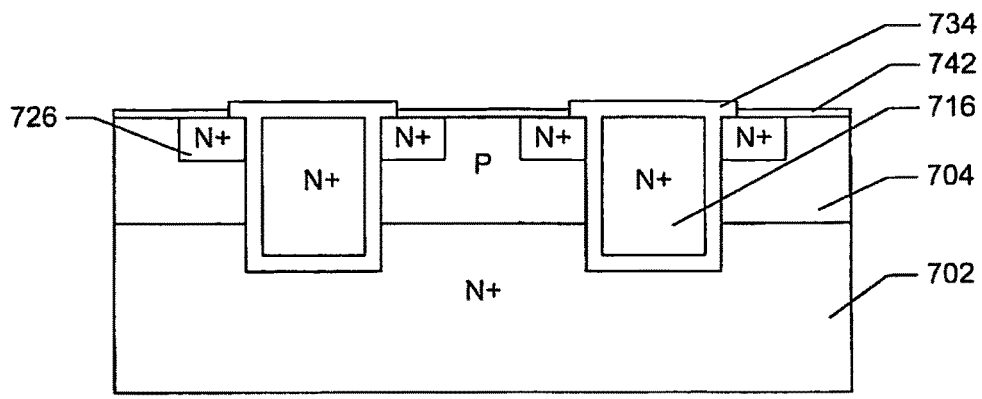

Referring now to FIG. 7I, a source/body metal layer 738 is deposited on the surface of the wafer, at 634. In one implementation, the source/body metal layer 738 is deposited by any well-known method such as sputtering. The source/body metal layer 738 may be tantalum, titanium, tungsten, titanium nitride, tantalum nitride, titanium silicide, and/or the like. Such metals are characterized by a relatively high melting point as compared to copper, aluminum, bismuth, indium and tin. The source/body metal layer 738 forms a contact with the body 720 and source regions 726 left exposed by the patterned dielectric 734. The source/body metal layer 738 is isolated from the gate region 714 by the patterned dielectric layer 734. A fifth photo-resist is deposited and patterned to form a source contact mask, at 640. The source contact mask defines a source contact region in each cell. Referring now to FIG. 7J, die source/body metal layer is then patterned utilizing a selective etching method to form the source/body contacts 747, at 642.

Referring now to FIG. 7K, a second dielectric layer 744 is deposited upon the wafer, at 644. In one implementation, the second dielectric layer 744 may be spin-on-glass (BPSG). At 646, a sixth photo-resist layer 746 is deposited and patterned to define a source fuse link mask 746. At 648, the portion of the second dielectric layer 744 left exposed by the source fuse link mask 746 is etched to define a plurality of trenches 748. Each trench 748 extends through the second dielectric layer 744 to a corresponding source/body contact 742. The source fuse link mask is removed, at 650.

Figure 7M:
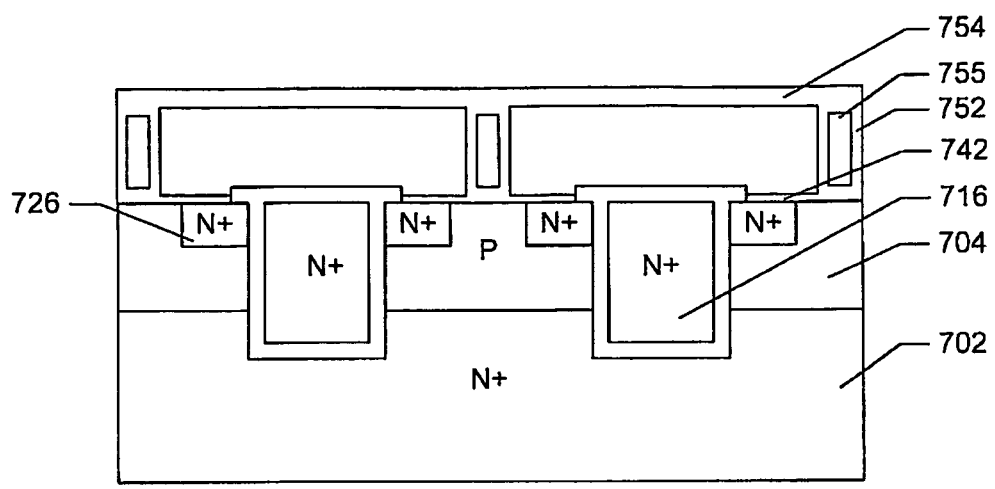

Referring now to FIG. 7L, a source fuse link metal layer 752 is deposited on the surface of the wafer, at 652. In one implementation, the source fuse link metal layer 752 is deposited by any well-known method such as chemical vapor deposition (CVD). The source fuse link metal layer 752 forms a metal film on the walls of the source fuse link trenches 748 and the exposed portion of the source/body contact 742. The source/body metal layer may be copper, aluminum, bismuth, indium, tin, and/or the like. Such metals are characterized by a relatively low melting point as compared to tantalum, titanium, tungsten, titanium nitride, tantalum nitride or titanium silicide. Referring now to FIG. 7M, a source interconnect metal layer 754 is deposited on the surface of the wafer, at 654. The source contact metal 742, source fuse link metal 752 and source interconnect metal 754 proximate the source fuse link trenches form a source fuse link having a cavity 755.

In another embodiment, the source fuse link trenches may have a larger aspect ratio. The source fuse link trenches are filled with a metal using a process such as sputtering. A photo-resist layer is deposited and patterned to define a source fuse link cavity in the metal deposited in the source fuse link trenches. A selective etching process is used to remove the exposed portion of the metal in the source fuse link trenches 748. The source interconnect metal layer is then deposited on the surface of the wafer.

At 656, the source interconnect metal layer 754 is patterned to form a source interconnect that is electrically coupled to the source contacts by the source fuse links. At 658, fabrication continues with various other processes. The various processes typically include etching, deposition, doping, cleaning, annealing, passivation, cleaving and/or the like.

Figure 8:
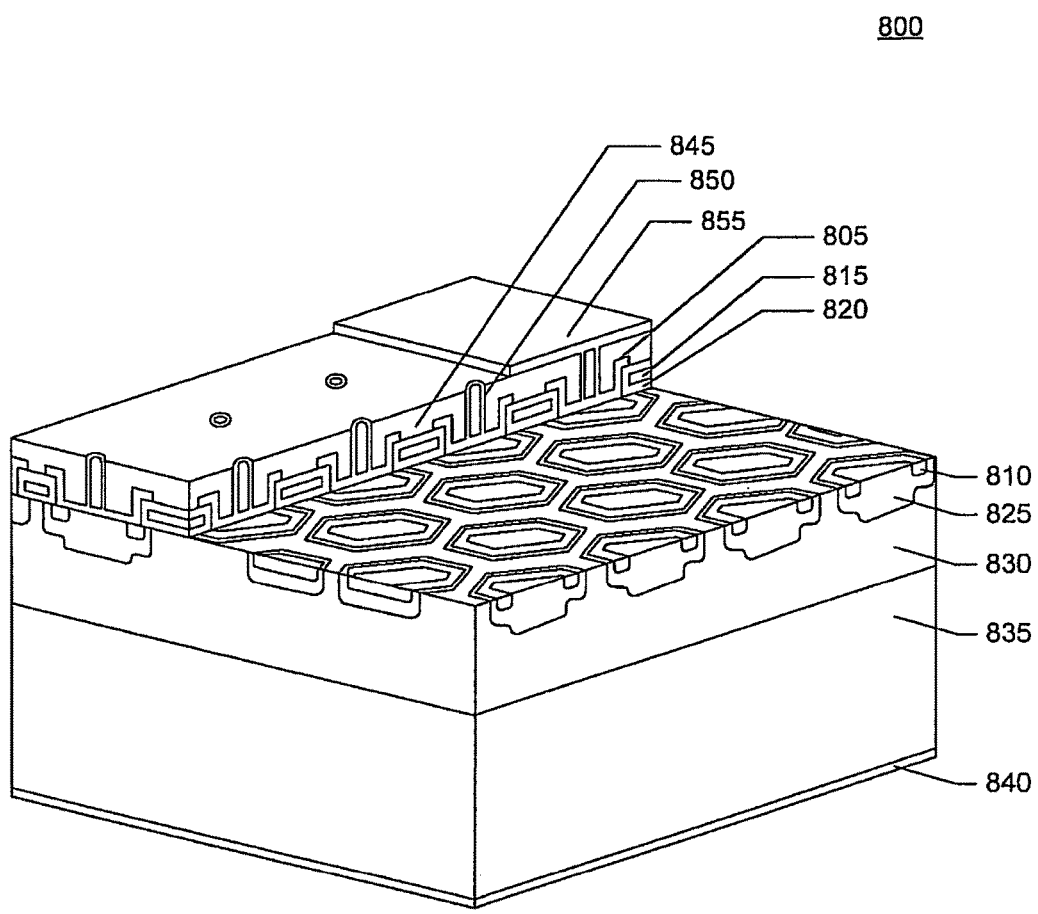
FIG. 8 shows a sectional view of an exemplary planar metal-oxide-semiconductor field effect transistor (MOSFET) device, in accordance with another embodiment of the present technology.

Referring now to FIG. 8, an exemplary planar metal-oxide-semiconductor field effect transistor (MOSFET) device, in accordance with one embodiment of the present technology, is shown. The planar MOSFET device 800 includes a plurality of source/body contacts 805, a plurality of source regions 810, a gate region 815, a gate insulator region 820, a plurality of body regions 825, a drain region 830, 835 and a drain interconnect 840. The planar MOSFET device 800 also includes an encapsulation layer 845, a plurality of source fuse links 850, and a source interconnect 855. The body regions 825, the source regions 810, the gate region 815 and the gate insulator region 820 are disposed above the drain region 830, 835. The body regions 825 are arranged as a plurality of polygon regions. In one implementation, the body regions 825 are hexagon regions. The drain region 830, 835 extends up between each polygon body regions 825. The source regions 810 are disposed in the body regions 825 proximate the perimeter of each body region 825 so that a portion of each body region 825 separates the corresponding source region 810 from the drain region 830, 835. The source regions 810 therefore are a polygon rings disposed in the body regions 825. The polygon shape of the body regions 825 and the source regions 810 are adapted so that the distance between adjacent sources 810 is relatively constant throughout the device 800.

The gate region 815 is disposed proximate the portion of the drain region 830, 835 that extends up between the body regions 825, proximate the portion of the body regions 825 between the source regions 805 and the drain region 830, 835, and proximate a portion of the source regions 810. The gate insulator region 820 surrounds the gate region 815, thereby separating the gate region 815 from the body regions 825, the source regions 810 and the drain region 830, 835. The drain region 830, 835 may include a first drain portion 830, usually referred to as a drift region, proximate the body regions 825 and a second drain portion 835, usually referred to as the drain region, separated from the body regions 825 by the drift region.

The source/body contacts 805 are each coupled to respective ones of the body regions 825 and source regions 810. Thus, the source/body contact 805 couples the source region 810 to the body region 825 of each cell. The encapsulation layer 845 is disposed between the source/body contacts 805 and the source interconnect 855. The source fuse links 850 extend through the encapsulation layer 845 between the source/body contacts 805 and the source interconnect 855. The source fuse links 850 vertically extend from the source/body contacts 805, on top of each individual cell, and therefore do not consume additional lateral surface area in the device 800.

When the potential of the gate region 815 is increased above the threshold voltage of the device 800, a conducting channel is induced in the portion of the body region 825 between the source regions 810 and the drain region 830, 835. The device 800 will then conduct current between the drain region 830, 835 and the source regions 810. Accordingly, the device 800 is in its on state. When the potential of the gate region 815 is reduced below the threshold voltage, the channel is no longer induced. As a result, a voltage potential applied between the drain region 830, 835 and the source regions 810 will not cause current to flow there between. Accordingly, the device is in its off state and the junction formed by the body region 825 and the drain region 830, 835 supports the voltage applied across the source and drain.

Each source fuse link 850 is constructed to be blown by a failure mode level of current. Accordingly, a defective cell is disabled and the rest of the cells remain functional. The device 800 is thus self-repairing with little or no performance degradation. In one implementation, the source fuse links 850 may be substantially solid. In another implementation, the source fuse links 850 may each contain a cavity that extends at least a portion of the length of each source fuse link.

Figure 9:
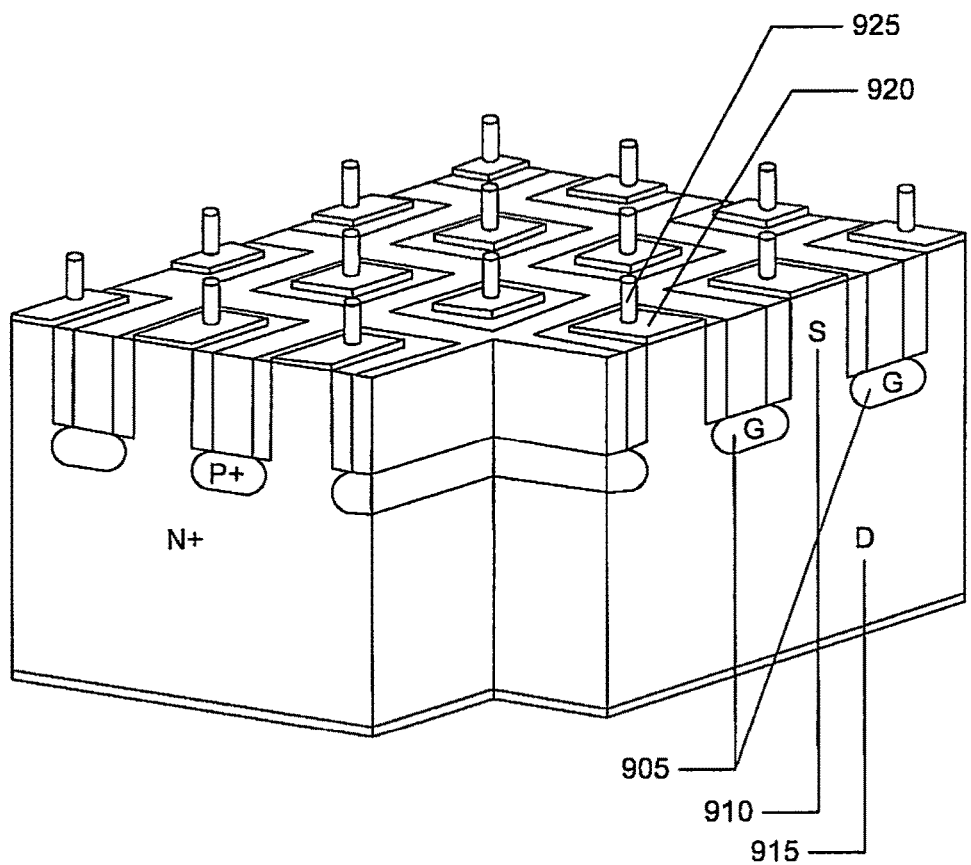
FIG. 9 shows a sectional view of an exemplary vertical junction field effect transistor (JFET) device, in accordance with another embodiment of the present technology.

Referring now to FIG. 9, an exemplary vertical junction field effect transistor (JFET) device, in accordance with one embodiment of the present technology, is shown. The vertical JFET device 900 includes a plurality of JFET cells 905, 910, 915, wherein each cell includes a corresponding source contact 920. The JFET device 900 also includes a source interconnect and a plurality of fuse links 925. Each source fuse link 925 couples a given source contact 920 to the source interconnect (not shown). The source fuse links 925 are adapted to be blown by a failure mode level of current.

Embodiments of the present invention can be used to disabled one or more cells in a FET device with gate-to-source, gate-to-drain, and/or source-to-drain short. The fuse link may be constructed for both planar and vertical FET devices. The fuse link may be vertically constructed without consuming additional silicon area. Accordingly, embodiments advantageously implement a self-repairing field effect transistor (FET) device.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the Claims appended hereto and their equivalents.

What is claimed is:

1. A device comprising:
a plurality of source contacts within a field effect transistor;
a plurality of field effect transistor cells within the field effect transistor, wherein each cell includes a corresponding source contact;
a source interconnect within the field effect transistor; and
a plurality of source fuse links disposed between the source interconnect and corresponding ones of the plurality of source contacts in corresponding trenches through an encapsulate layer, wherein a top of a gate of at least one of the plurality of field effect transistor cell is below the bottom of the encapsulate layer, wherein the encapsulate layer is disposed between the source interconnect and the plurality of source contacts within the field effect transistor, and wherein each source contact is coupled to the source interconnect by a given one of the plurality of source fuse links configured to blow in response to a high current.

2. The field effect transistor device of claim 1, wherein each source fuse link includes a cavity.

3. The field effect transistor device of claim 1, wherein a corresponding source fuse link blows during a high current event in a defective field effect transistor cell.

4. The field of transistor device of claim 1, wherein a source fuse link disables a corresponding field effect transistor cell when there is a source-to-drain short in the particular field effect transistor cell.

5. The field effect transistor device of claim 1, wherein a source fuse link disables a corresponding field effect transistor cell when there is a gate-to-source short in the particular field effect transistor cell.

6. The field effect transistor device of claim 1, wherein:
the plurality of source contacts comprise a metal having a relative high melting point; and
the plurality of source fuse links comprise a metal having a relatively low melting point.

7. The field effect transistor device of claim 1, wherein the plurality of field effect transistor cells comprise approximately five hundred to five billion field effect transistor cells.

8. The field effect transistor device of claim 1, wherein the field effect transistor cells comprise planar metal-oxide-semiconductor field effect transistor cells.

9. The field effect transistor device of claim 1, wherein the field effect transistor cells comprise vertical metal-oxide-semiconductor field effect transistor cells.

10. The field effect transistor device of claim 1, wherein he source contacts, source fuse links and source interconnect are aligned in a axis perpendicular to a fabrication surface of the field effect transistor device.

11. An integrated circuit comprising:
 continuous drain region;
 a gate region disposed above said continuous drain region, wherein a first portion of the gate region is formed as a first plurality of substantially parallel elongated structures and a second portion of the gate region is formed as a second plurality of substantially parallel elongated structures that are perpendicular to the first plurality of substantially parallel elongated structures;
 a plurality of source regions disposed proximate a periphery of the gate region between the first and second plurality of substantially parallel elongated structures;
 a plurality of body regions disposed between said continuous drain region and the plurality of source regions and between the first and second plurality of substantially parallel elongated structures;
 a gate insulator region disposed between the gate region and the plurality of source regions, between the gate region and the plurality of body regions and between the gate region and said continuous drain region;
 a plurality of source contacts, wherein each source contact is coupled to a corresponding source region and body region;
 a source interconnect;
 a dielectric layer disposed between the plurality of source contacts and the source interconnect: and
 a plurality of source fuse links disposed in corresponding trenches through the dielectric layer, wherein at least a portion of a top of the gate region is below the bottom of the dielectric layer, wherein each source fuse link couples a. given source contact to the source interconnect and that result in a break in a high current path when blown.

12. The integrated circuit of Claim 11, wherein each source fuse link includes a cavity adapted to concentrate heat.

13. The integrated circuit of Claim 11, wherein each source fuse link comprises metal having a cavity extending substantially from the corresponding source contact to the source interconnect.

14. The integrated circuit of Claim 11, wherein each source fuse link comprises metal having a cavity substantially in a middle of the source fuse link.

15. The integrated circuit of Claim 11, wherein each source fuse link comprises metal and is adapted to be blown by a failure mode level of current.

16. A device comprising:
 a plurality of source regions within a field effect transistor;
 a unitary drain region within the field effect transistor;
 a unitary gate region within the field effect transistor;
 a plurality of source contacts within the field effect transistor, wherein the plurality of source contacts are coupled to corresponding ones of the plurality of source regions;
 a unitary source interconnect within the field effect transistor; and
 a plurality of source fuse links within the field effect transistor, wherein the plurality of source fuse links are coupled between the unitary source interconnect and corresponding ones of the plurality of source contacts, and wherein a first one of the plurality of source fuse links electrically isolates a first one of the plurality of source contacts from a. second one of the plurality of source contacts when blown.

* * * * *

UNITED STATES PATENT AND TRADEMARK OFFICE
CERTIFICATE OF CORRECTION

PATENT NO. : 10,600,902 B2
APPLICATION NO. : 12/030719
DATED : March 24, 2020
INVENTOR(S) : Robert Xu It is certified that error appears in the above-identified patent and that said Letters Patent is hereby corrected as shown below:

On the Title Page

In the Title on the left column, and in the Specification, on Column 1, Lines 1 to 2, please delete "SELF-REPAIRING FIELD EFFECT TRANSISITOR" and insert --SELF-REPAIRING FIELD EFFECT TRANSISTOR--.

Signed and Sealed this
Thirteenth Day of October, 2020

Andrei Iancu
*Director of the United States Patent and Trademark Office*